HIGH SPEED NON-SATURATING SWITCHING CIRCUIT
Filed March 15, 1966 2 Sheets-Sheet 1
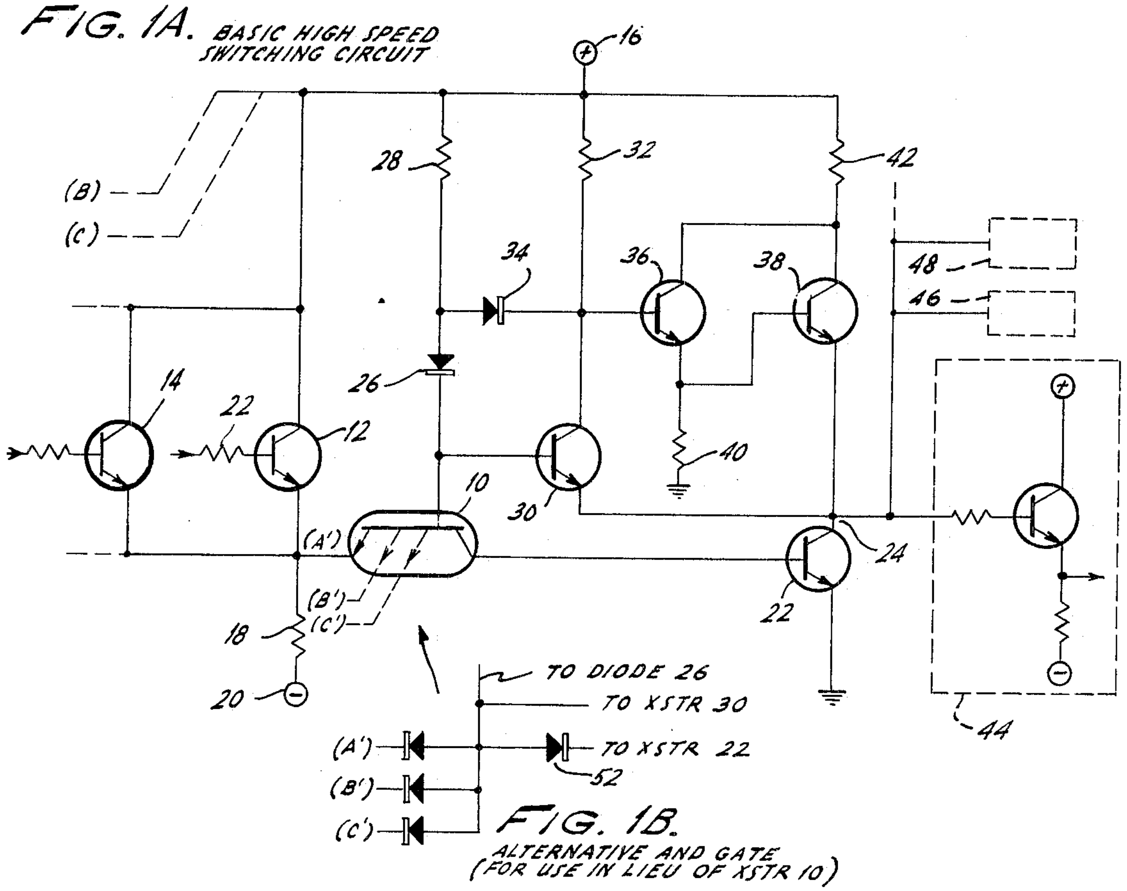
FIG. 1A. FIG. 1B.
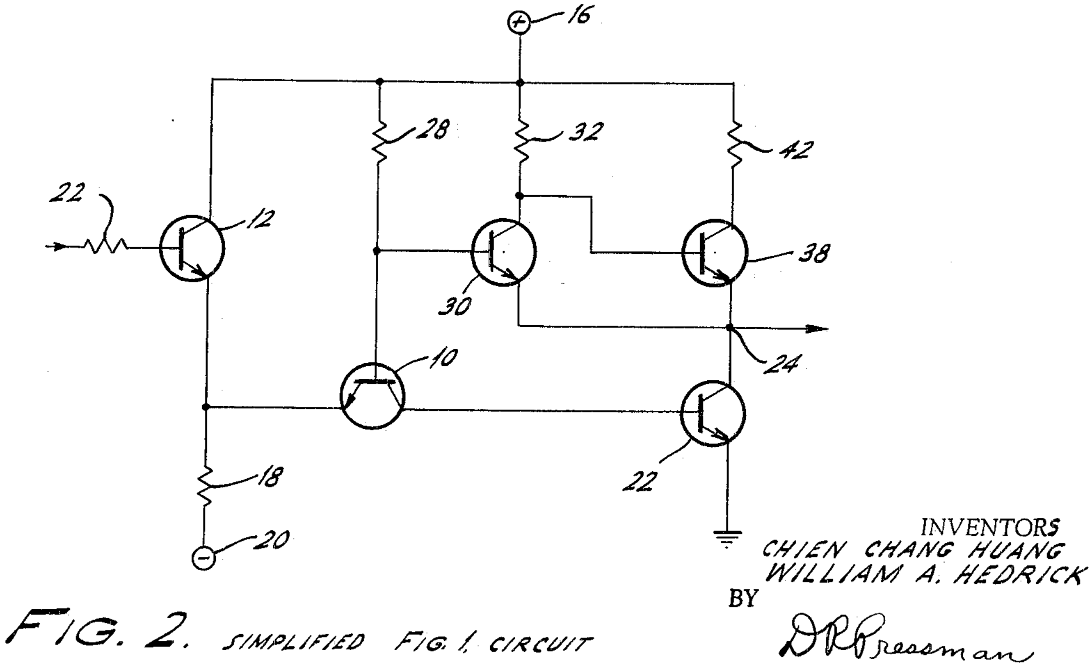
FIG. 2. SIMPLIFIED FIG. 1 CIRCUIT
INVENTORS
CHIEN CHANG HUANG
WILLIAM A. HEDRICK
BY
D R Pressman
ATTORNEY HIGH SPEED NON-SATURATING SWITCHING CIRCUIT
Filed March 15, 1966
2 Sheets-Sheet 2
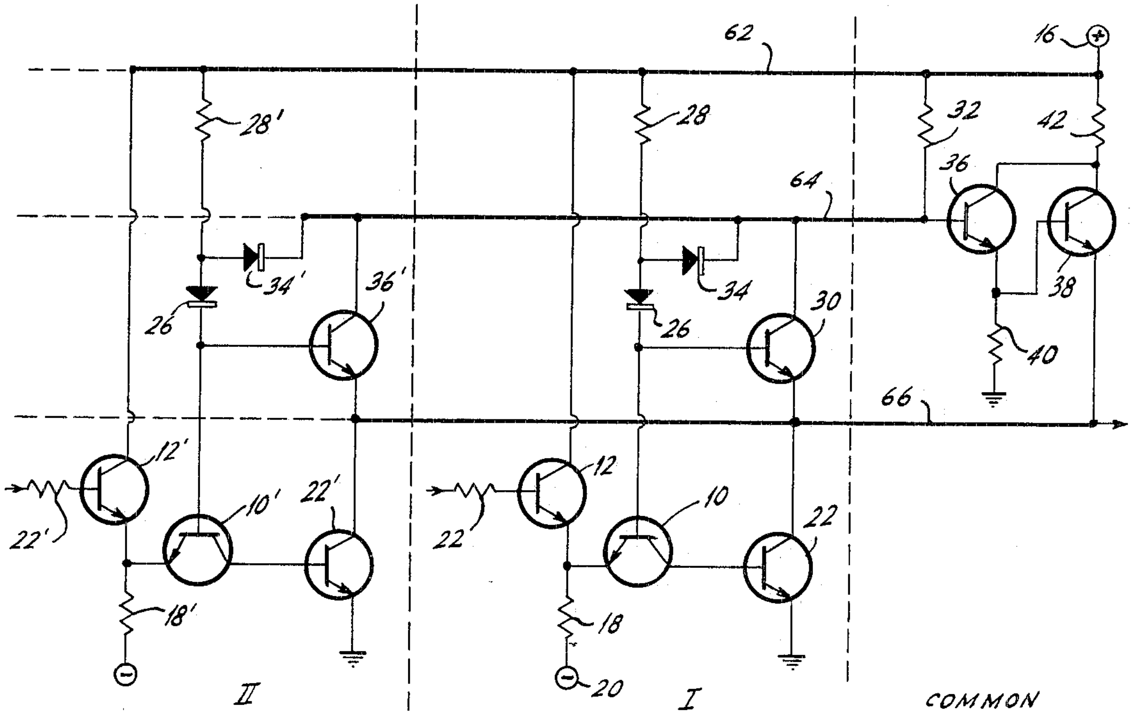
FIG. 4. HIGH SPEED SWITCHING CIRCUIT WITH ADDITIONAL INPUT PROVIDED BY DUPLICATION OF PORTION OF CIRCUIT
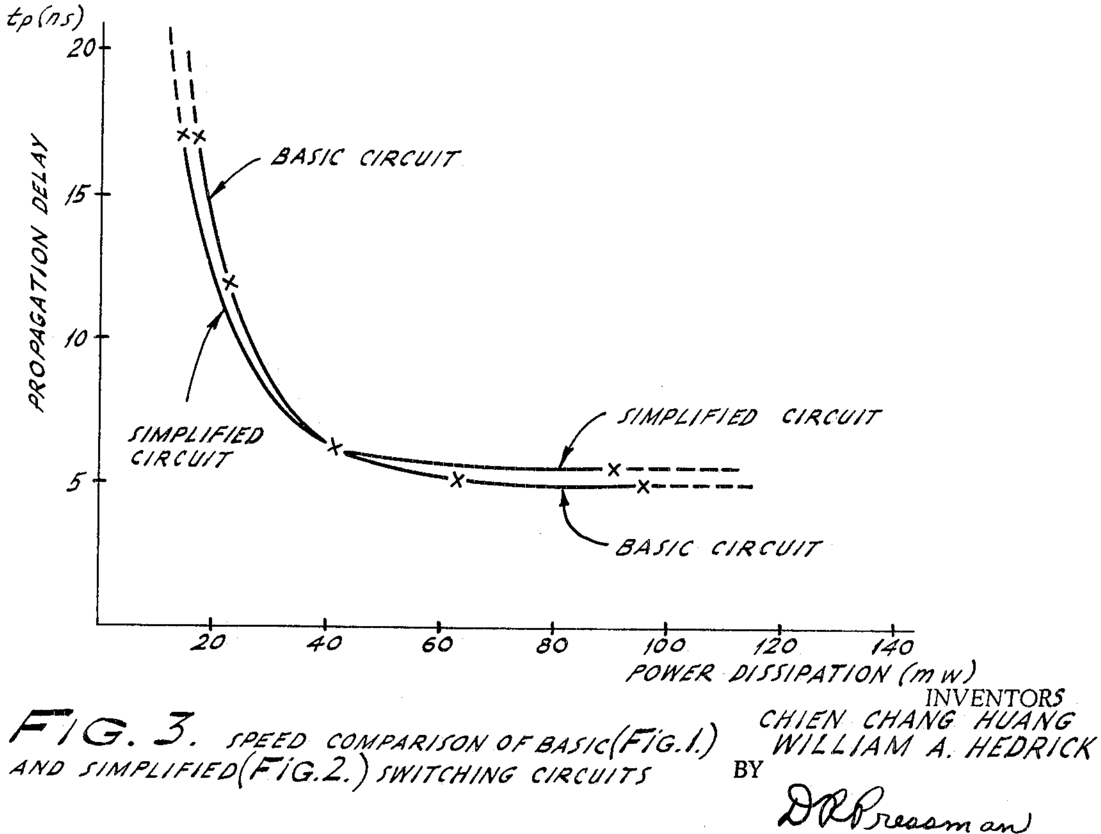
FIG. 3. SPEED COMPARISON OF BASIC (FIG. 1.) AND SIMPLIFIED (FIG. 2.) SWITCHING CIRCUITS
INVENTORS
CHIEN CHANG HUANG
WILLIAM A. HEDRICK
BY
D R Breasman
ATTORNEY United States Patent Office 3,512,016
Patented May 12, 1970

3,512,016

HIGH SPEED NON-SATURATING SWITCHING CIRCUIT

Chien Chang Huang, and William A. Hedrick, Lansdale, Pa., assignors to Philco-Ford Corporation, a corporation of Delaware Filed Mar. 15, 1966, Ser. No. 541,440
Int. Cl. H63k 17/00
U.S. Cl. 307—300 15 Claims

ABSTRACT OF THE DISCLOSURE

A high speed non-saturating switching circuit comprising, in its basic form, first and second transistors, the emitter-collector circuits of which are connected in series across a supply source and a third transistor, the emitter of which is connected to the output terminal formed by the junction of the first and second transistors, and the collector of which drives the base of the second transistor. Means are provided for driving the first and third transistors in like phase, whereby the first and second transistors will be driven in push-pull. The emitter diode of the third transistor limits the driving source voltage, thereby preventing the first transistor from saturating. A fourth transistor preferably is provided to drive the third and first transistors. The base and collector of the fourth transistor are connected, respectively, to the base of the third transistor and the base of the first transistor; thus changes in the emitter potential of the fourth transistor will produce like changes in the base potentials of the first and third transistors.

This invention relates to switching circuits and more particularly to very high speed transistor switching circuits of the antisaturating type which may be constructed conveniently in monolithic microcircuit form.

In the design of high speed transistor logic and switching circuits, certain goals are desirable. The most important consideration, of course, is that of speed. Since many thousands of switching and logic circuits will usually be cascaded in a digital computer, the switching or propagation speed of each circuit determines to a large extent the speed capability of the overall computer. Since the operating time of digital computers is very costly, it is highly desirable that a computer's operating speed be as fast as possible.

Another goal in transistor switching circuitry design is high fan-in and fan-out capability. To have high fan-in capability, a switching circuit should not have an unduly high input capacitance or an unduly low input impedance. If these conditions are met many of the same type of switching circuit can be connected in parallel to the output of single driver without unduly loading the same. To have a fan-out capability, the switching circuit should provide a very low output impedance during both pulse-rise and pulse-fall intervals. Thereby a single switching circuit will be able to drive many circuits without being loaded down to the point of instability or appreciable speed decrease.

Another desired feature of switching circuitry is a low-speed-power dissipation product. As is well known, the switching speed of a circuit can usually be increased by increasing the supply voltage or by decreasing the value of a load resistor. As is well known, these changes will increase the power dissipated in the switching circuit. A point is reached in the design of all circuits, however, wherein further power increases will not provide further decreases in switching speed. This is the point at or near which it is most desirable to operate high speed circuits. It is highly desirable to have a switching circuit in which the speed-power dissipation product is as low as possible in order to provide the highest available speed with the lowest possible use of power Other features desrable in switching circuits are versatility and noise immunity To have good noise immunity a switching circuit should have an input-output voltage transfer characteristic curve which has a relatively sharp break or bend therein, rather than being linear as is the case with an audio amplifier. A non-linear circuit will insure that small noise impulses below the regular signal input level will not appear in significantly amplified form at the output. To have expansion versatility a circuit should be able to be easily adapted to perform a variety of functions such as the OR, AND, NOR, NAND, and NOT (invert) functions, as well as being abole to accommodate many inputs and outputs.

The above desiderata are achieved to a substantially greater extent in the circuit of the present invention than was heretofore obtainable in prior art switching circuits. Accordingly several objects of the present invention are: (1) to provide a switching circuit of superior speed, (2) to provide a switching circuit having superior fan-in and fan-out capablities, (3) to provide a switching circuit having a superior speed-power dissipation product, (4) to provide a switching circuit having high non-linearity and hence good noise immunity, and (5) to provide a switching circuit which has good expansion versatility. Other objects of the present invention are (6) to provide an improved switching circuit of the antisaturating type, and (7) to provide an improved transistor-transistor logic switching circuit. Further objects of the present invention will become apparent from a consideration of the ensuing description thereof.

DRAWINGS

In the drawings, FIG. 1A shows a basic version of a high speed switching circuit of invention, and FIG. 1B shows an alternative component for use in the circuit of FIG. 1A. FIG. 2 shows a simplified version of the FIG. 1A circuit. FIG. 4 shows a high speed switching circuit similar to that of FIG. 1A with an additional input provided by duplication of a portion of the circuit of FIG. 1A, and FIG. 3 shows a speed-power dissipation plot of the circuits of FIG. 1A and FIG. 2.

FIGS. 1A AND 1B—DESCRIPTION

The basic high speed switching circuit of the invention is shown in FIG. 1A. The primary function of the switching circuit is the logical NOT operation, but to demonstrate the versatility of this circuit, it is shown connected to the output of an AND gate, each input of which is connected to the output of an OR gate which has a plurality of inputs. Thus the basic logical chain provided by the circuit in FIG. 1 is the OR—AND—NOT operation. To illustrate the fan-out capabilities of the circuit, the output thereof is shown as commonly connected to the inputs of a pluraliy of further circuits, each further circuit being similar to the circuit of FIG. 1A. The circuit of FIG. 1A is especially adapted to production in monolithic microcircuit form wherein all of the components shown are formed within a single chip of silicon, according to current microcircuit practice. Thus although the components shown in FIG. 1A will be described as discrete entities, it will be understood that the following description and claims cover the case where all of the components shown are formed within a single chip of silicon.

The AND gate in FIG. 1A comprises a multi-emitter transistor 10, which may be formed by diffusing a plurality of separate emitter islands into the base region of a transistor. Each of the three emitters shown comprises a separate input to the AND gate. An OR gate is shown connected to the first input (A') of the AND gate, said OR gate comprising a plurality of transistors, 12 and 14, the emitter-collector circuits of which are connected between a positive potential source 16 and the emitter (A′) of transistor 10. A common emitter resistor 18 is connected between emitter (A′) and a negative source 20. As indicated by the dashed lines, further inputs to the OR gate can be obtained by adding additional transistors in parallel with transistors 12 and 14. Each of the transistors 12 and 14 has associated therewith a base resistor of low value such as 22 to prevent oscillation. (If the entire switching circuit is to comprise merely a simple NOT circuit, transistor 10 will have only one emitter; also only one emitter follower transistor 12 with its associated bias circuitry 18, 20 should be provided.)

Each additional emitter of transistor 10 can also be connected to the output of an OR gate as indicated by the dashed pairs of lines, (B)—(B′) and (C)—(C′). As will be obvious, as many emitters and emitter resistors such as 18 as are desired can be provided according to the desired number of inputs to the AND gate.

The collector of transistor 10 is connected directly to the base of an inverter output transistor 22. The emitter of transistor 22 is grounded and the collector thereof constitutes an output terminal 24 of the switching circuit. The base of transistor 10 is connected via a voltage offset diode 26 (which is always forward-biased) and a bias resistor 28 to the positive source 16, and is also directly connected to the base of a control transistor 30. The collector of transistor 30 is connected to source 16 by a load resistor 32, to the junction between diode 26 and resistor 28 by way of a further diode 34, and to the base of transistor 36. The emitter of transistor 30 is connected to the collector of transistor 22 (output terminal 24).

Transistor 36 and transistor 38, to which the former is coupled, together constitute a Darlington pair with the output being taken at the emitter of transistor 38, which is also connected to output terminal 24. The emitter of transistor 36 is coupled to the base of transistor 38 and is connected to ground via resistor 40. The collectors of transistors 38 and 36 are commonly connected to positive source 16 via a surge limiting resistor 42. As is well known, a Darlington circuit provides a very high beta, and since the output of the present Darlington circuit is taken at the emitter of transistor 38, it will provide a very low output impedance.

While the high speed switching circuit of the present invention can be used to drive any type load, in most instances, since it is designed for use in a computer, it will drive one or more circuits similar to itself. Thus an exemplary load 44 is shown which comprises an emitter follower input stage similar to the stages incorporating transistor 12 and 14. To illustrate the fan-out capability of the circuit, a plurality of additional loads 46 and 48 are shown (in block form) connected in parallel to output terminal 24.

FIG. 1A—OPERATION OF CIRCUIT

Prior to discussing the operation of the inverter part of the circuit, the operation of the OR and AND gates will be discussed briefly.

The OR gate including transistors 12 and 14 operates as follows. If no inputs are applied to the bases of either transistor 12 or transistor 14, neither of these transistors will conduct, and the negative bias circuit 18, 20 will forward bias emitter (A′) of transistor 10. The potential of emitter (A′) will be governed by the current flowing from the base of transistor 10, through emitter (A′), and through resistor 18 to negative source 20.

If a positive input voltage is supplied to the base of transistor 12 or transistor 14, or both, one or both of these transistors will conduct, providing a very low impedance path between source 16 and emitter (A′). The voltage of emitter (A′) will thus rise to a positive value, thereby reverse-biasing the junction between the base and emitter (A′) of transistor 10. Thus it will be seen that the presence of one or more or all inputs to each OR gate will cause the associated emitter junction of transistor 10 to become reverse biased.

The AND gate comprising transistor 10 operates in the following manner. As long as one or more of the emitter junctions of transistor 10 is forward biased, current will flow from source 16 through resistor 28 and diode 26 to the base of transistor 10 and thence through one or more of the forward biased emitters to negative source 20 via one or more of the resistors similar to resistor 18. The voltage at the base of transistor 10 will be relatively low. The collector voltage of transistor 10 will also be relatively low and insufficient to turn on transistor 22.

Now assume that positive voltages are supplied to all of the emitters of transistor 10, causing all of the emitter junctions to become reverse-biased. The current flowing from the base to said emitters will be diverted from the emitters to the collector of transistor 10, thereby turning transistor 22 ON. Also, the base voltage of transistor 10 will rise. It will thus be seen that transistor 10 operates as an AND gate, i.e., when and only when all of the emitter junctions thereof are reverse biased will the base voltage rise and current be supplied to the collector of transistor 10.

It will be appreciated that alternatively the AND gate function provided by transistor 10 can be provided by a conventional diode AND gate such as shown in FIG. 1B. As will be obvious to those skilled in the art, the AND gate of FIG. 1B will operate in the same manner as the AND gate comprising transistor 10, the connections being indicated. The difference in the potentials between the base and collector of transistor 10 due to the forward voltage drop of the collector junction of transistor 10 can be provided by a diode 52, connected as shown.

The operation of the rest of the switching circuit will now be described. For reference purposes, when the AND gate comprising transistor 10 does not have all inputs high, the outputs thereof will be referred to as a "low" output, and when all the emitter junctions of transistor 10 are reverse biased, the collector and base thereof will be referred to as supplying a "high" output.

When less than all of the OR gates are energized, the output of the AND gate comprising transistor 10 will be low, transistor 22 will be OFF, and the voltage at output terminal 24 will be relatively high. Thus the emitter voltage of transistor 30 will be high and transistor 30 will also be OFF. With transistor 30 OFF, the collector voltage of transistor 30 will be high, so that a positive voltage will be supplied to the base of transistor 36, maintaining said transistor ON. Transistor 36, being connected in the emitter follower mode, will supply a positive voltage to transistor 38, thereby maintaining transistor 38 ON and allowing current to be supplied from source 16 to the load connected to terminal 24.

Next assume that all of the emitter junctions of transistor 10 are reverse biased. The current which flowed from source 16 through resistor 28 and diode 26 to the emitters of transistor 10 will be diverted rapidly to the collector of transistor 10, thereby turning transistor 22 ON with a slight positive overdrive which tends to increase the turn on speed of transistor 22. Conduction of transistor 22 will cause the potential at terminal 24 to fall very close to ground, thereby lowering the emitter potential of transistor 30. The positive voltage at the base of transistor 10 will turn transistor 30 ON. According to the invention, transistor 30 will limit the potential at the base of transistor 10 by conducting current from the base of transistor 10 to output terminal 24, thereby preventing transistor 22 from being driven to a state of saturation. This materially increases the switching speed of the circuit since no charge carriers will be stored in transistor 22, thereby enabling transistor 22 to be turned off rapidly. However this increase in switching speed is obtained without a sacrifice in the turn-on speed of transistor 22 usually associated with antisaturation circuits inasmuch as the base-to-emitter current of transistor 10 will provide the aforenoted temporary overdrive to the base of transistor 22 when all the emitters of transistor 10 go positive.

In a similar fashion, diode 34 will prevent transistor 30 from saturating. When transistor 30 becomes conductive, diode 34 will shortly thereafter become conductive, thereby connecting the bottom of resistor 28 to the collector of transistor 30 so as to limit the potential at the lower end of resistor 28 and prevent transistor 30 from saturating. Transistor 30 can thereby also be turned off rapidly since it stores no charge carriers.

Conduction of transistor 30 will cause the potential at the collector thereof to fall, thereby decreasing the conduction of transistor 36. Transistor 36 is not turned off, however, since according to the invention, it is desirable to maintain this transistor always conductive to avoid any turn on delay. It is for this reason that resistor 40 is connected from the emitter of transistor 36 to ground. When conduction of transistor 36 is decreased, transistor 38 will be turned off, thereby disconnecting output terminal 24 from the positive source 16. A small resistor 42 is used to limit the surge current which flows when transistor 22 is turned on and transistor 38 is not yet turned off.

It will be appreciated that any capacitance associated with the loads connected to terminal 24 will be discharged rapidly by transistor 22 since said transistor is turned on with the aforementioned initial overdrive which will briefly saturate transistor 22, thereby briefly providing a very low impedance between terminal 24 and ground.

Next, if one or more of the emitters of transistor 10 are again forward biased, current will be diverted from the collector of transistor 10 to the forward biased emitters thereof, thereby turning off transistor 22 and hence transistor 30. The voltage at the collector of transistor 30 will rise, thereby increasing conduction of transistor 36 which will drive transistor 38 to conduction. As stated, the Darlington circuit will be able to charge rapidly any capacitance associated with the load connected to terminal 24.

The circuit of FIG. 1 has been found to operate at very high speeds in comparison to prior art switching circuits. The high speed is attributable to the above emphasized factors, and in addition, to the following factors: Transistor 10 will switch very rapidly from base-to-emitter to base-to-collector conduction since only a charge redistribution is required. Both transistor 22 and transistor 30 are turned on by an initial base current overdrive which is governed only by the magnitude of the positive source 16 and resistor 28. Transistor 36 and 38 will switch very rapidly because neither is ever driven into saturation. Diode 26 is always conducting and thus it does not affect switching speed.

The circuit has very high fan-in and fan-out capabilities for the following reasons. Fan-in capability is high because no charging of parasitic capacitance is required inasmuch as the collectors of transistor 12 and 14 are always maintained at a constant potential, i.e., that of source 16. The common emitter junction capacitance of transistors 12 and 14 can be kept very low in integrated circuits by using very small geometries. The input capacitance to the AND gate, i.e., that of transistor 10, will also be very small in integrated circuits. Since the input load of the circuit of FIG. 1 is low, fan-out capability is also high. Load capacitance can be discharged and charged rapidly because of the low impedance of the Darlington pair (transistors 36 and 38) and the low impedance of transistor 22 including the initial overdrive thereof.

The circuit has been found to have a very sharp break in the input-output voltage characteristic curve and hence good noise immunity is assured.

The circuit as shown in FIG. 1 has been operated successfully with components having the following values, which are approximate only and which should not be construed as a limitation of the invention or as optimum values.

Resistor 22—Several ohms (sufficient to prevent oscillation of emitter follower stages)
Resistor 18—680 ohms
Resistor 28—1680 ohms
Resistor 32—470 ohms
Resistor 42—125 ohms
Resistor 40—5000 ohms
Positive source 16—3.5 v.
Negative source 20——2.5 v.

FIG. 2—SIMPLIFIED CIRCUIT

A simplified version of the circuit of FIG. 1A is shown in FIG. 2. In FIG. 2, to facilitate illustration, the multiple transistors of the OR gate and the multiple emitters of transistor 10 are not shown, but it will be understood that hese components may be used in like manner as in FIG. 1A. Components in FIG. 2 having functions similar to those in FIG. 1A have been identified with like reference numerals. The circuit of FIG. 2 is substantially identical to the circuit of FIG. 1A with the following exceptions: transistor 36 of the Darlington pair and its associated emitter resistor 40 have been eliminated, as have diodes 34 and 36.

The circuit of FIG. 2 provides the same advantages as the circuit of FIG. 1A with the exception that the circuit of FIG. 1A provides a lower output impedance between positive source 16 and output terminal 24 due to the use of the Darlington pair and also provides a faster turn-off speed for transistor 30 since diodes 26 and 34 serve to prevent saturation thereof. FIG. 3 shows a comparison of the switching speeds versus power dissipation curves of the circuits of FIGS. 1A and 2. FIG. 3 demonstrates that in the low power region the simplified circuit is faster while in the high power region the basic circuit of FIG. 1A is faster. Thus the simplified circuit of FIG. 2 is attractive for its simplicity in form and lower power requirement. However, for ultimately faster switching speeds, the circuit of FIG. 1A is superior.

FIG. 4

FIG. 4 illustrates an alternative way of increasing the input capabilities of the circuit of FIG. 1A. In FIG. 4 the elements in the "common" and the I portions of the circuit are identical to corresponding elements in FIG. 1 and hence are identified by like reference numerals. That portion of the FIG. 4 circuit identified by the reference II is a duplication of the I portion of the circuit of FIG. 4. Elements in section II are given primed reference numerals coresponding to unprimed reference numerals of elements in the I portion.

The common portion of the circuit comprises the Darlington output circuit and resistor 32, the load resistor for transistor 30. Three busses, designated 62, 64 and 66, and shown in heavy lines, are used to connect the common portion of the circuit to the portions I and II. The logical function provided by portion I and the common portion is the NOT function. With addition of one or more additional portions similar to portion I, such as portion II, several inputs to the inverter are provided, thus implementing the "OR-NOT function." The operation of the FIG. 4 circuit is the same as that of FIG. 1A, except that resistor 32 serves as a common load resistor for all of the transistors such as 30 and the Darlington circuit (transistors 36 and 38) is common to the entire system.

We claim:

1. A switching circuit comprising, in combination:

(a) an output circuit comprising a pair of transistors, the emitter of a first connected to a point maintained at a first potential, the collector of a second connected to a point maintained at a second potential, the collector of the first connected to the emitter of the second to form an output terminal, (b) a third transistor having a collector connected to said second potential point via a load impedance and an emitter connected to said output terminal, (c) means connected between the collector of said third transistor and the base of said second transistor and arranged to drive the base of said second transistor in like phase with and in response to the voltage variations at the collector of said third transistor, and (d) means connected to the base of said first transistor and the base of said third transistor and arranged to drive said first and said third transistors in like phase in succession to conductive and nonconductive states.

2. The combination of claim 1 wherein said (d) means comprises a fourth transistor having a base connected (1) to the base of said third transistor and (2) to said second potential point via a second impedance, a collector connected to the base of said first transistor, and an emitter forming an input terminal.

3. The combination of claim 1 wherein said (c) means comprises a transistor having a collector connected to the collector of said second transistor, an emitter connected to the base of said second transistor, and a base connected to the collector of said third transistor.

4. The combination of claim 2 further including an emitter follower transistor circuit arranged to drive the emitter of said fourth transistor.

5. The combination of claim 1 including means for preventing said third transistor from saturating.

6. The combination of claim 5 wherein said means comprises first and second diodes, said first diode being connected between the collector of said third transistor and said impedance, said second diode connecting said impedance to the base of said fourth transistor.

7. A switching circuit comprising, in combination:

(a) a first transistor connected in the common emitter configuration, the emitter thereof being connected to a first point, (b) a second transistor, the emitter thereof connected to the collector of said first transistor, the collector thereof connected to a second point maintained substantially at a first potential different from that of said first point, (c) a third transistor, the collector thereof connected to the base of said first transistor, the base thereof connected to said second point via a first impedance, (d) means for alternatively (1) forward biasing the base-emitter junction of said third transistor and thereby reverse biasing the base-emitter junction of said first transistor, and (2) reverse biasing the base-emitter junction of said third transistor and thereby forward biasing the base-emitter junction of said first transistor, and (e) means for (1) turning said second transistor on when the base-emitter junction of said third transistor is forward biased and for turning said second transistor off when the base-emitter junction of said third transistor is reverse biased, and (2) for supplying operating current to the collector of said first transistor from said second point, said means also being arranged to prevent said first transistor from saturating when the base-emitter junction thereof is forward biased.

8. The combination of claim 7 wherein said (e) means comprises (1) a fourth transistor, the base thereof connected to the base of said third transistor, the emitter thereof connected to the collector of said first transistor, and the collector thereof connected to said second point via a second impedance, and (2) means coupling said collector of said fourth transistor to the base of said second transistor.

9. The combination of claim 8 further including means for preventing said fourth transistor from being driven to a state of saturation.

10. The combination of claim 9 wherein said means comprises a diode connected between the collector of said fourth transistor and said first impedance.

11. The combination of claim 7 wherein said (d) means comprises a fifth transistor connected in the emitter follower configuration, the output of said emitter follower being connected to the emitter of said third transistor.

12. The combination of claim 7 wherein said third transistor has a plurality of emitters and one base and wherein said (d) means is arranged to selectively forward and reverse bias individually all of said emitter base junctions.

13. The combination of claim 8 wherein said means coupling the collector of said fourth transistor to the base of said second transistor comprises an additional transistor, the base thereof connected to the collector of said fourth transistor, the emitter thereof connected to the base of said second transistor, and the collector thereof connected to the collector of said second transistor.

14. The combination of claim 7 wherein said (d) means comprises a plurality of transistors, the collectors thereof all connected to said second point, and the emitters thereof all connected to the emitter of said third transistor and, via a common impedance, to a second point maintained substantially at a second potential.

15. The combination of claim 7 further including (1) an additional transistor, the collector and emitter thereof being connected to the collector and emitter, respectively, of said first transistor, (2) a further transistor, the collector thereof connected to the base of said additional transistor, and base thereof connected to said second potential point via an additional impedance, (3) means for alternatively (a) forward biasing the base-emitter junction of said further transistor and thereby reverse biasing the base-emitter junction of said additional transistor, and (b) reverse biasing the base-emitter junction of said further transistor and thereby forward biasing the base-emitter junction of said additional transistor, and (4) means for (a) turning said second transistor on when the base-emitter junction of said further transistor is forward biased and for turning said second transistor off when the base-emitter junction of said further transistor is reverse biased, and (b) for supplying operating current to the collector of said additional transistor from said second point, said means also being arranged to prevent said additional transistor from saturating when the base-emitter junction thereof is forward biased.

References Cited

UNITED STATES PATENTS

| | | | |
|---|---|---|---|
| 3,118,073 | 1/1964 | Walsh | 307—300 |
| 3,157,797 | 11/1964 | Shelman | 307—254 |
| 3,160,765 | 12/1964 | Krossa | 307—254 |
| 3,067,934 | 12/1962 | Macher et al. | 307—214 |
| 3,229,119 | 1/1966 | Bohn et al. | 307—214 |
| 3,351,782 | 11/1967 | Narud et al. | 307—218 |
| 3,378,695 | 4/1968 | Marette | 307—211 |
| 3,394,268 | 7/1968 | Murphy | 307—214 |

OTHER REFERENCES

Wrona, S.: Switching Circuit, IBM Technical Disclosure Bulletin, vol. 8, No. 9, February 1966, p. 1301.

Sylvania: This is SUHL (Sylvania Universal High-level Logic) Brochure.

JOHN S. HEYMAN, Primary Examiner

D. M. CARTER, Assistant Examiner

U.S. Cl. X.R.

307—254